(12) United States Patent
Menard

(10) Patent No.: US 7,718,473 B2
(45) Date of Patent: May 18, 2010

(54) HF CONTROL BIDIRECTIONAL SWITCH

(75) Inventor: Samuel Menard, Tours (FR)

(73) Assignee: STMicroelectronics S.A, Montrouge (FR)

( * ) Notice: Subject to any disclaimer, the term of this patent is extended or adjusted under 35 U.S.C. 154(b) by 0 days.

(21) Appl. No.: 11/643,444

(22) Filed: Dec. 21, 2006

(65) Prior Publication Data
US 2007/0145408 A1    Jun. 28, 2007

(30) Foreign Application Priority Data
Dec. 26, 2005    (FR) .................................. 05 54094

(51) Int. Cl.
*H01L 21/332*    (2006.01)
*H01L 29/74*    (2006.01)
(52) U.S. Cl. ...................... 438/133; 438/134; 438/135; 438/136; 257/107; 257/119; 257/157; 257/E21.388; 257/E21.392
(58) Field of Classification Search ................ 257/107, 257/E29.218, E27.052, E27.079, E21.388, 257/E21.392; 327/453
See application file for complete search history.

(56) References Cited

U.S. PATENT DOCUMENTS

| | | | | | |
|---|---|---|---|---|---|
| 3,344,310 | A | * | 9/1967 | Nuckolls | 315/199 |
| 3,824,444 | A | * | 7/1974 | Spink | 363/87 |
| 4,630,092 | A | * | 12/1986 | Bhagat | 257/135 |
| 4,649,414 | A | * | 3/1987 | Ueda et al. | 257/137 |
| 4,779,036 | A | * | 10/1988 | Shinoda | 323/236 |
| 5,359,279 | A | | 10/1994 | Gidon et al. | |
| 5,608,237 | A | * | 3/1997 | Aizawa et al. | 257/132 |
| 6,066,542 | A | * | 5/2000 | Reznik et al. | 438/406 |
| 6,091,087 | A | * | 7/2000 | Iwamuro et al. | 257/133 |
| 7,259,407 | B2 | * | 8/2007 | Menard et al. | 257/107 |
| 7,561,408 | B2 | * | 7/2009 | Pezzani | 361/437 |
| 2002/0066904 | A1 | * | 6/2002 | Yuan et al. | 257/83 |
| 2003/0075990 | A1 | | 4/2003 | Guitton et al. | |
| 2004/0135620 | A1 | * | 7/2004 | Pezzani | 327/453 |
| 2005/0082565 | A1 | * | 4/2005 | Menard et al. | 257/119 |
| 2005/0082566 | A1 | * | 4/2005 | Menard et al. | 257/119 |

OTHER PUBLICATIONS

French Search Report from French Patent Application 05/54094, filed Dec. 26, 2005.
Bourgeois J.M.: "PCB based transformer for power MOSFET drive" Applied Power Electronics Conference and Exposition, 1994, APEC '94 Conference Proceedings 1994., Ninth Annual Orlando FL, USA Feb. 13-17, 1994, New York, NY, USA, IEEE, Feb. 13, 1994, pp. 238-244, XP010118565.

* cited by examiner

*Primary Examiner*—Charles D Garber
*Assistant Examiner*—Mohsen Ahmadi
(74) *Attorney, Agent, or Firm*—Lisa K. Jorgenson; James H. Morris; Wolf, Greenfield & Sacks, P.C.

(57) ABSTRACT

An HF control bi-directional switch component of the type having its gate referenced to the rear surface formed in the front surface of a peripheral well of the component, including two independent gate regions intended to be respectively connected to terminals of a transformer having a midpoint connected to the rear surface terminal of the component.

2 Claims, 2 Drawing Sheets

HF CONTROL BIDIRECTIONAL SWITCH

BACKGROUND OF THE INVENTION

1. Field of the Invention

The present invention relates to the forming of an HF (high frequency)-control switch.

2. Discussion of the Related Art

U.S. Pat. No. 6,862,196, which is incorporated herein by reference, relates to a thyristor control structure comprising an HF (high frequency) control source connected via a transformer to the gate-cathode circuit of a thyristor, a diode being interposed in this gate-cathode circuit.

It is disclosed in the above-mentioned US patent that, if the HF frequency is high enough, a miniaturized transformer formed on a glass substrate may be used. In this patent, examples of operating frequencies on the order of 40 MHz or more are given. Various advantages of this control mode are mentioned: transformer miniaturization, simplified assembly of the transformer and of the thyristor, improvement of the insulation, control of head-to-tail thyristors etc.

It is also known, as illustrated in FIG. 1, to provide an assembly of the same type to control a bi-directional switch 1 having its gate-cathode circuit connected to a secondary winding of a transformer T with an interposed series diode D.

As illustrated in FIG. 2, bi-directional switch 1 of FIG. 1 may be a bi-directional switch of the type having its control referenced to the rear surface terminal. Such a component is schematically and partially illustrated in the cross-section view of FIG. 2. It comprises a power portion comprising NPNP and PNPN thyristors in parallel. These two thyristors are formed in a structure comprising a lightly-doped N-type substrate 10. On the lower and upper surface sides are formed P-type layers, 11 and 12, layer 11 being on the upper surface side and layer 12 on the lower surface side. In region 11, an N-type region 13 on the left-hand side of the drawing is formed so that a vertical NPNP thyristor is formed of region 13, of layer 11, or substrate 10, and of layer 12. An N-type 14 layer is formed on the rear surface side at least in front of the portion of P-type region 11 in which N region 13 is not formed. A vertical PNPN thyristor comprising regions and layers 11, 10, 12, and 14 is thus formed. In this type of component referenced to the rear surface, the gate is formed of an $N^+$-type region 16 formed on the upper surface side of a peripheral well or diffusion wall 18 surrounding the entire bi-directional switch.

It should also be noted that U.S. published patent application No. 2005/0082565 of the applicant describes an HF control of a bi-directional component structure. This patent application specifically describes the case where the bi-directional component structure comprises a gate terminal and a gate reference terminal. The control signal is then applied between these terminals, the gate reference terminal being distinct from the main front surface terminal.

It is often attempted to decrease the sensitivity of bi-directional components to spurious triggerings linked to voltage peaks (dV/dt sensitivity) and to improve their switching performances, that is, in particular, for the conduction during a halfwave not to cause a conduction during a next halfwave of opposite polarity (di/dt sensitivity to switching). This, however, poses a problem in that, when a bi-directional component is desensitized to make it less sensitive to noise, it is also less sensitive to a normal control signal. This problem is all the more acute when the frequency of the HF control signal is desired to be increased, the power contained in each halfwave then being lower.

SUMMARY OF THE INVENTION

An object of the present invention is to provide HF (high frequency) control bi-directional switch structure exhibiting a robust insensitivity to spurious triggerings and good switching performance, and however capable of being controlled by an HF signal of moderate intensity.

To achieve these and other objects, the present invention provides an HF control bi-directional switch component of the type having its gate referenced to the rear surface formed in the front surface of a peripheral well of the component, comprising two independent gate regions intended to be respectively connected to terminals of a transformer with a midpoint having its midpoint connected to the rear surface terminal of the component.

According to an embodiment of the present invention, each of the gate regions comprises a metallization in contact with a region of a conductivity type opposite to that of the peripheral well, formed in a region of the same conductivity type as the peripheral well and with a higher doping level.

According to an embodiment of the present invention, the gate regions are formed symmetrically, opposite to the main front surface electrode.

The foregoing and other objects, features, and advantages of the present invention will be discussed in detail in the following non-limiting description of specific embodiments in connection with the accompanying drawings.

DETAILED DESCRIPTION

As usual in the representation of semiconductor components, the various cross-section and top views are not drawn to scale.

Figure 1:
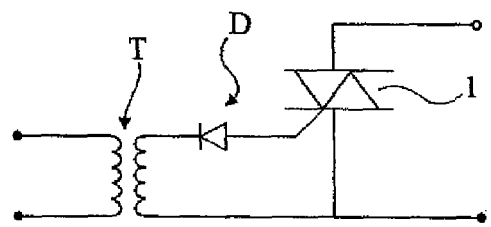
FIG. 1 is a conventional electric diagram of an HF-control bi-directional switch.
Figure 2:
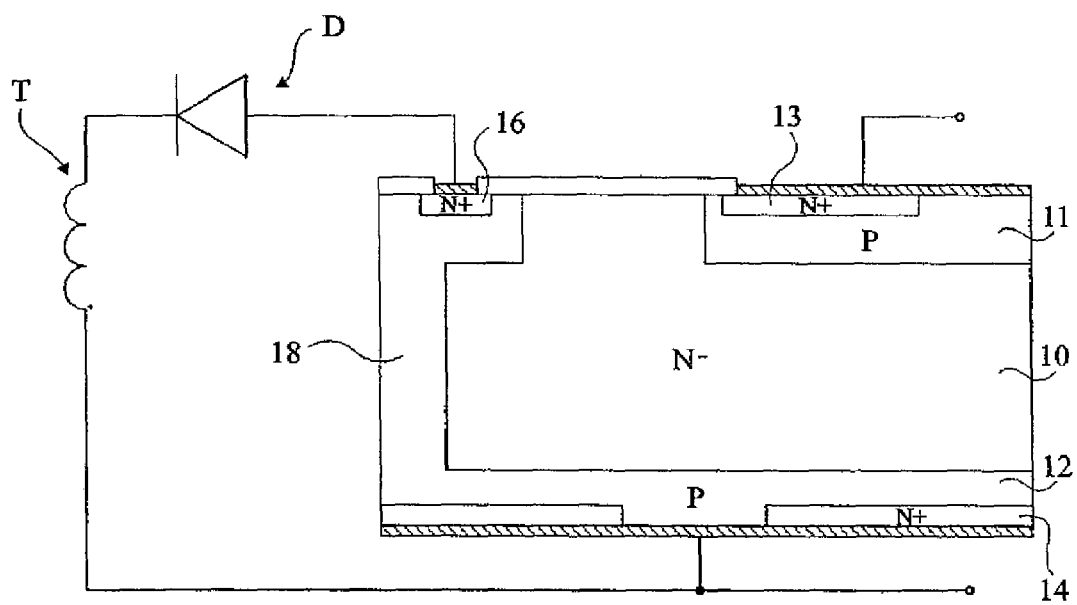
FIG. 2 is a simplified cross-section view of a conventional example of a bi-directional switch adapted to an HF control.

In an HF control of the type illustrated in FIGS. 1 and 2, the high-frequency signal is rectified by diode D and is only active on the gate to control the component triggering one halfwave out of two of the applied HF voltage. The efficiency of the control is thus decreased. There may be a charge accumulation linked to the control, whereby the component can only start after several halfwaves of the HF signal. However, in the case where the HF signal is only effectively applied during one halfwave out of two, the losses during the non-useful halfwave are significant and may prevent the component from triggering.

It would theoretically be possible to improve this operation by sending onto the gate a fullwave rectified HF signal. However, the forming of fullwave rectifying bridges at high frequencies, that may rise up to a few gigahertz, is not simple, poses problems, and causes losses. Such losses are especially linked to the fact that if a diode bridge is used, the control signal crosses three forward-biased diodes (two bridge diodes plus the gate junction diode); this requires a minimum voltage of approximately 3(0.6)=1.8 V at the control transformer secondary.

The present invention provides modifying a bi-directional switch component so that it is sensitive to the two halfwaves of an HF control signal, without using a diode bridge.

Figure 3:
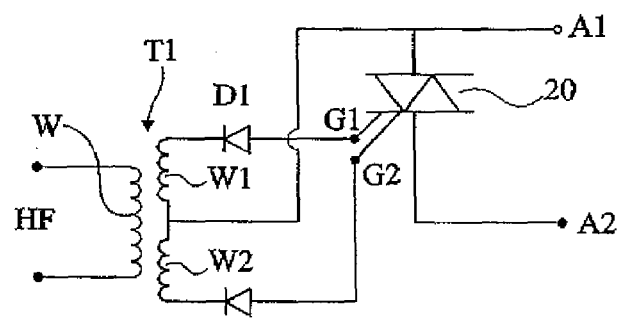
FIG. 3 is an electric diagram of a bi-directional switch adapted to an HF control according to the present invention.

FIG. 3 shows a circuit diagram of an HF control bi-directional switch according to the present invention. Bidirectional switch 20 according to the present invention comprises two independent gate terminals G1 and G2 in addition to its main terminals A1 and A2. The HF signal is applied across a primary winding W of a transformer T1 having its secondary comprising two windings in series W1 and W2. Each of these windings is arranged between a gate and the cathode of the component with a respective interposed diode D1, D2. The midpoint of the transformer secondary is connected to the main gate reference terminal, rear surface A1, in the case of a bi-directional switch of the type having a control referenced with respect to the rear surface which will be considered hereafter. Thus, in positive halfwaves, a first gate is controlled and in negative halfwaves, the other gate is controlled. The HF control signal is then always efficient.

However, this system does not operate with a conventional component. A component comprising two distinct gates needs to be provided.

The applicant has shown that the forming of two mutually insulated gates is particularly simple in the case of a bi-directional switch of the type having its control referenced with respect to the rear surface, in which the control region is arranged in the peripheral well of insulation of an actual power component.

Figure 4A:
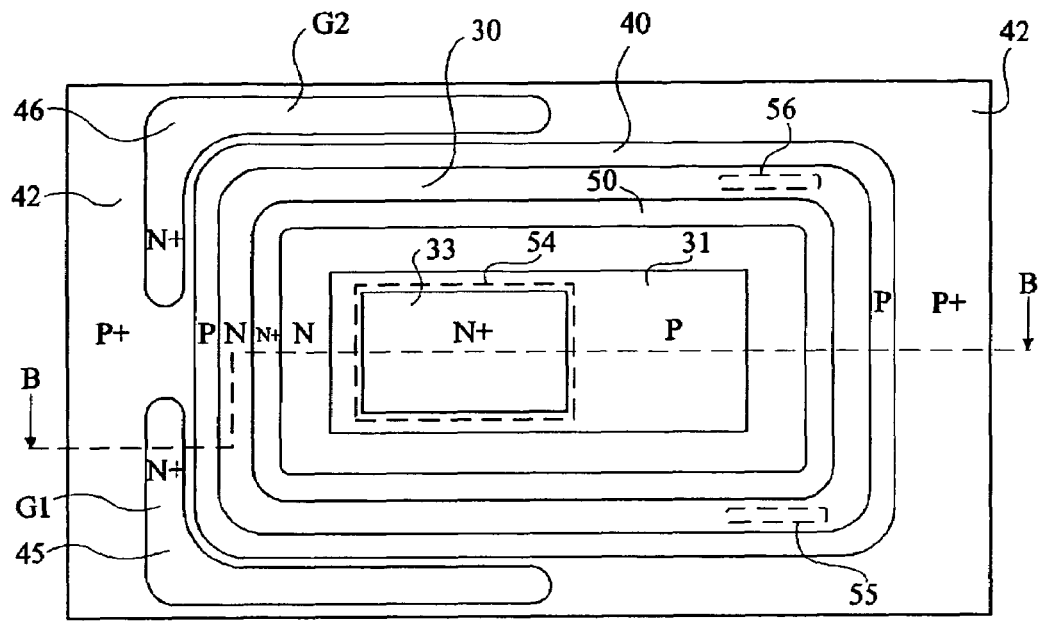
FIGS. 4A and 4B respectively are a top view and a cross-section view along line B-B of FIG. 4A of a bi-directional switch adapted to an HF control according to the present invention.
Figure 4B:
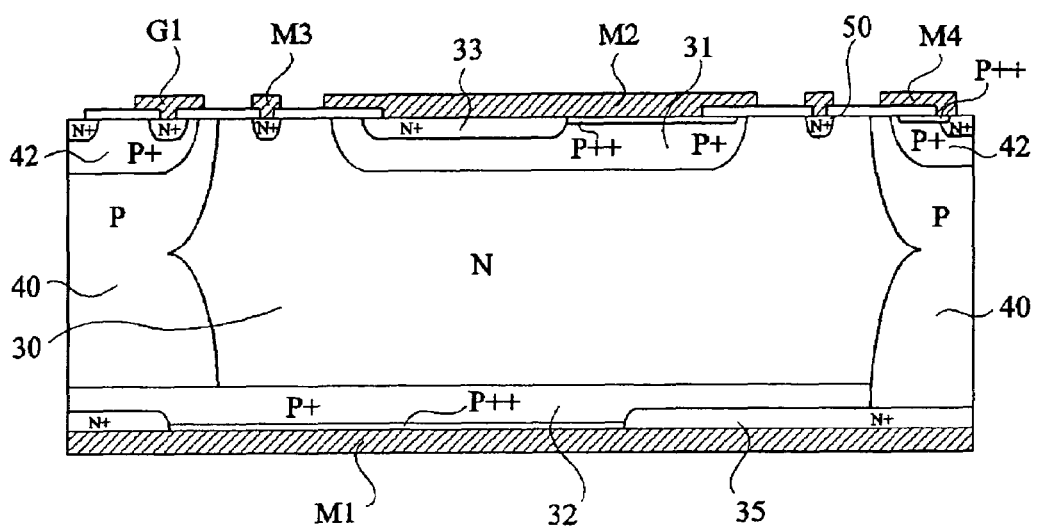

A component according to the present invention is illustrated in top view in FIG. 4A and in cross-section view in FIG. 4B. The cross-section view of FIG. 4B is taken along plane B-B of FIG. 4A, which cuts one gate region, but not the other. Accordingly, a single gate region is visible in FIG. 4B.

In this cross-section view, given that a single gate can be seen, the component structure is substantially identical to that of the component shown in FIG. 2. The demultiplication of the gates, visible in top view, is a feature of the component according to the present invention.

Thus, the cross-section view of FIG. 4B shows a vertical power semiconductor component forming a bi-directional switch having its power portion formed in a substrate 30 comprising on its front or upper surface side a P-type region 31 and on its rear or lower surface side a P-type region 32. An N-type region 33 is formed in region 31 to form a first vertical NPNP thyristor comprising regions and layers 33, 31, 30, and 32. On the rear surface side, opposite to the portion of P region 31 in which N-type region 33 is not formed, is formed an N-type region 35 to form a second vertical PNPN thyristor formed of regions and layers 31, 30, 32, 35. A rear surface metallization M1 covers the entire rear surface. A main front surface metallization M2 covers regions 33 and 31. As known in the field of bi-directional components with a gate referenced to the rear surface sold under trademark ACS by the applicant, there preferably exists an $N^+$ region everywhere on the lower surface side except substantially opposite to region 33.

The entire component is surrounded with a heavily-doped P-type well or peripheral insulating wall 40, for example formed by drive-in from the upper and lower surfaces of the component but that may be formed in any other adapted fashion. On the front surface side, a heavily-doped P-type region 42 is formed in insulating wall 40 without coming into contact with substrate 30. Heavily-doped N-type regions 45 and 46 corresponding to gate regions are formed in region 42, in substantially symmetrical fashion on either side of $N^+$ region 33. Gate terminals G1 and G2 are formed on regions 45 and 46. Gate terminals G1 and G2 are intended to be connected as shown in FIG. 3.

Further, a heavily-doped N-type ring 50 on the upper surface side used as a channel stop surrounding P-type region 31, substantially halfway between region 31 and the edges of insulating wall 40, has been shown in the cross-section view of FIG. 4B. This ring is optional and has been illustrated to show that all usual structure variations may be adopted. Various metallizations and insulation areas are shown in the cross-section view of FIG. 4B and are not shown, for simplicity, in the top view of FIG. 4A. Especially, gate metallization G1, a metallization M3 intended to be used as an equipotential surface on channel stop region 50, and also a metallization M4 intended to be used as an equipotential surface on the upper surface of $P^+$ region 43 can be seen in the cross-section view. Metallizations M3 and M4 are not reconnected to external terminals. Regions designated with reference $P^{++}$ intended to improve the contact areas on P regions 31 and 32 have also been shown in the cross-section view. The structure, inasmuch as this concerns the cross-section view of FIG. 4B, is a conventional structure to which those skilled in the art may bring all the modifications currently adopted for bi-directional switches with a control electrode referenced to the rear surface.

In the top view of FIG. 4A, the possible limit of the opening formed in the $N^+$-type lower surface region 35 on the rear surface side has been shown by a dotted line 54 around $N^+$ region 33. Similarly, possible interruptions on the rear surface side of $N^+$ layer 35 intended to optimize the sensitivity of the bi-directional component have been shown by dotted lines 55 and 56.

Due to the present invention, the parameters of the bi-directional switch may be selected for said switch to be of average sensitivity, the control by the high-frequency gate voltage being particularly efficient since it acts on the two halfwaves of the HF voltage.

Of course, the present invention is likely to have various, alterations, improvements, and modifications which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An HF control bi-directional switch component of the type having its gate referenced to the rear surface of the component and formed in the front surface of a peripheral well of the component, the HF control bi-directional switch component comprising:

two independent gate regions, wherein the two gate regions comprise respective semiconductor regions having a same conductivity type, and wherein the two gate regions are respectively responsive to positive or negative halfwaves of a high-frequency control signal provided by terminals of a transformer winding having a midpoint connected to the rear surface terminal of the component;

wherein each of the gate regions comprises a metallization in contact with the respective semiconductor regions, wherein the same conductivity type of the respective semiconductor regions is opposite to that of the peripheral well, formed in a region of the same conductivity type as the peripheral well and with a higher doping level.

2. The HF-control bi-directional switch component of claim 1, wherein the gate regions are formed symmetrically opposite to the main front surface electrode.

* * * * *